United States Patent
Gösele et al.

(10) Patent No.: US 6,589,333 B1
(45) Date of Patent: Jul. 8, 2003

(54) METHOD FOR THE MANUFACTURE OF A SUBSTRATE, SUBSTRATE MANUFACTURED IN ACCORDANCE WITH THIS METHOD, CARRIER WAFER AND DIAMOND JEWEL

(75) Inventors: Ulrich Gösele, Halle (DE); Andreas Plössl, Regensburg (DE)

(73) Assignee: Max-Planck-Gesellschaft zur Foerderung der Wissenschaften e.V., Munich (DE)

( * ) Notice: Subject to any disclaimer, the term of this patent is extended or adjusted under 35 U.S.C. 154(b) by 0 days.

(21) Appl. No.: 09/665,216

(22) Filed: Sep. 18, 2000

(30) Foreign Application Priority Data

Sep. 17, 1999 (DE) .................................. 199 44 716
Sep. 5, 2000 (DE) .................................. 100 43 587

(51) Int. Cl.⁷ ................................................ C30B 25/02

(52) U.S. Cl. .................. 117/84; 117/94; 117/95; 117/96; 117/918; 117/929

(58) Field of Search ............................ 117/84, 94, 95, 117/96, 929, 918

(56) References Cited

U.S. PATENT DOCUMENTS

| | | | |
|---|---|---|---|
| 5,443,032 A | * 8/1995 | Vichr et al. ............. | 117/84 |
| 5,525,537 A | 6/1996 | Zachai et al. | |
| 5,665,607 A | 9/1997 | Kawama et al. | |
| 5,743,957 A | 4/1998 | Kobashi | |
| 5,782,975 A | * 7/1998 | Linn ..................... | 117/89 |
| 5,877,070 A | 3/1999 | Goesele et al. | |
| 5,882,786 A | 3/1999 | Nassau et al. | |
| 5,961,719 A | * 10/1999 | Buhaenko et al. ........ | 117/103 |
| 5,964,942 A | * 10/1999 | Tanabe et al. .......... | 117/87 |

FOREIGN PATENT DOCUMENTS

| | | |
|---|---|---|
| DE | 4415601 A1 | 11/1995 |
| DE | 19631107 A1 | 2/1997 |
| EP | 1006567 A2 | 6/2000 |

OTHER PUBLICATIONS

X. Jiang, et al. "Expitaxial diamond thin films on (001) silicon substrates" *Appl. Phys. Lett.*, vol. 62(26) pp. 3438–3440, Jun. 28, 1993.

U. Gösele, "The Role of Carbon and Point Defects in Silicon" *Mat. Res. Soc. Symp. Proc.* vol. 58 pp. 419–431, (1986).

C. Guedj, et al. "Precipitation of β–SiC in $Si_{1-y}C_y$ alloys" *J. Appl. Phys.*, vol. 84(8) pp. 4631–4633, (1998).

W. Faschinger, er al. "Molecular beam expitaxy of pseudomorphic silicon/carbon superlattices on silicon substrates" *Appl. Phys. Lett.* vol. 67(18) p. 2630, Oct. 30, 1995.

(List continued on next page.)

Primary Examiner—Robert Kunemund
(74) Attorney, Agent, or Firm—Townsend and Townsend and Crew LLP (57) ABSTRACT

A method is described for the production of a suitable substrate for the subsequent growth of a mono-crystalline diamond layer. This method includes the following steps:

Selection of a substrate of a mono-crystalline material having a fixed lattice constant ($a_{Si}$) or with a layer consisting of such a material.

Manufacture of a strained silicon layer with foreign material atoms incorporated at substitutional lattice sites on the mono-crystalline material of the substrate.

Transfer of the strained layer into an at least partly relaxed state in which it adopts by relaxation and through the selected foreign material concentration a lattice constant ($a_{Si(C)}$) which satisfies the condition $n \cdot a_{Si(C)} = m \cdot a_D$, wherein n and m are integers and $a_D$ is the lattice constant of diamond, with the relaxed layer forming the substrate or substrate surface for the epitaxial growth.

27 Claims, 6 Drawing Sheets

OTHER PUBLICATIONS

A.R. Powell, et al. "Stability of strained $Si_{1-y}C_y$ random alloy layers" *J. Vac. Sci. Techol.* vol. 11(3), pp. 1064–1068, May/Jun. 1993.

Jean–Francois Damlencourt, et al. "Paramorphic Growth: A New Approach in Mismatched Heteroepitaxy to Prepare Fully Relaxed Materials" *Japanese J. Appl. Pys.* vol. 38, pp. 996–999, (1999).

J.F. Damlencourt, et al. "High–quality fully relaxed $In_{0.65}As$ layers grown on InP using the paramorphic approach" *Applied Physics Letters* vol 75(23) pp. 3638–3640, Dec. 6, 1999.

Q.–Y. Tong, et al. "Layer splitting process in hydrogen–implanted Si, Ge,SiC, and diamond subtrates" *Appl. Phys. Lett.* vol. 70(11), pp. 1390–1392 (1996).

M. Bruel, "Silicon on insulator material technology" *Electronic Letters*, vol. 31(14), pp. 1201–1202, Jul. 6, 1995.

Jan Haisma, et al. "Surface Preparation nad Phenomenological Aspects of Direct Bonding" *Philips J. Res.* vol. 49, pp. 23–46 (1995).

V. Lehmann, et al. Implanted Carbon: Effective Etch–Stop in Silicon, *J. Electrochem.Soc.* 138 (1991).

\* cited by examiner

METHOD FOR THE MANUFACTURE OF A SUBSTRATE, SUBSTRATE MANUFACTURED IN ACCORDANCE WITH THIS METHOD, CARRIER WAFER AND DIAMOND JEWEL

BACKGROUND OF THE INVENTION

The invention relates to a method for manufacture of a suitable substrate for the subsequent growth of a single crystal diamond layer and for the manufacture of a single crystal diamond layer, to a substrate as well as to a carrier wafer and a diamond jewel.

Single crystal diamond layers are particularly desirable for applications in high temperature electronics. Diamond is a crystalline high-pressure phase of carbon which is metastable under normal conditions. The stable phase is graphite. In addition to naturally occurring diamonds, diamonds are also produced artificially by a high-pressure method. These diamonds are normally very small and are used for grinding purposes because of the hardness of the diamonds. For electronic applications of diamonds, it is principally thin, single crystal diamond layers that are of interest. High-temperature applications which are made possible by the high band gap of diamond of about 5 eV are at the center of interest. Diamond can in principle be deposited epitaxially onto single crystal diamond by means of chemical vapor deposition (CVD) in a corresponding hydrogen atmosphere. The presence of hydrogen serves in this connection for the preferential etching away of the stable equilibrium phase in the form of graphite, which is likewise deposited. For practical applications, the epitaxy of diamond layers on single crystal diamond crystals is not of great importance, because only very small single crystal diamond substrates are available and because large area substrates of other materials with similar lattice constants to diamond do not exist. In the case of microelectronics and optoelectronics there are, however, semiconductor wafers which are commercially available in part with a diameter of up to 30 cm. Since no large area single crystal diamond substrates are available, numerous efforts have been made to produce single crystal diamond layers on other easily available substrates. The best success hitherto has been achieved with (100) orientated silicon substrates on which strongly textured, likewise almost (100) orientated diamond layers can be deposited by means of suitable CVD methods using an electrical voltage at the silicon substrate. These diamond layers consist of individual single crystal diamond grains in the micron range, which are twisted and tilted relative to the silicon substrate, with the twisting and tilting angles lying in the order of magnitude of about 1°. So-called grain boundaries thereby arise at points at which individual diamond grains abut, and greatly impair the electronic characteristics of the diamond film. It would, in contrast, be desirable to avoid these grain boundaries in order to actually produce a single crystal diamond layer. These diamond layers are described in the article by X. Jiang et al., Appl. Phys. Lett. 62 (1993) 3438.

SUMMARY OF THE INVENTION

It is an object of the present invention to provide a method for the manufacture of a substrate for the growth of single crystal diamond layers and also corresponding substrates which make it possible to produce extended single crystal diamond layers by epitaxy, so far as possible without disturbing grain boundaries, and diamonds built up on this for electronic and/or other purposes, such as industrial cutting and grinding processes, or in the form of diamond jewels.

The method of the invention for the manufacture of a suitable substrate for the subsequent growth of a single crystal diamond layer is characterized by the following steps:

a) selection of a substrate of a mono-crystalline material having a fixed lattice constant ($a_{Si}$) or with a layer consisting of such a material, b) manufacturing either a strained silicon layer with foreign material atoms incorporated at substitutional lattice sites on the monocrystalline material of the substrate, c) transferring the strained layer into an at least partly relaxed state in which it adopts by relaxation and through the selected foreign atom concentration a lattice constant ($a_{Si(C)}$) which satisfies the condition $$n \cdot a_{Si(C)} = m \cdot a_D$$

where n and m are integers, preferably different integers, and $a_D$ is the lattice constant of diamond, with the relaxed layer forming the substrate, for example the substrate surface, for the epitaxial growth of the diamond layer.

In particular it is proposed that carbon atoms should be used for the foreign material atoms and n should be selected=2 and m=3.

The method of the invention is based on the fundamental realization that the almost epitaxial alignment of the diamond layers which can be grown on (100) silicon wafers is to be associated with the fact that the lattice constant of diamond $a_D$ has an almost rational relationship to the lattice constant of the silicon $a_{Si}$, so that one can write $$2a_{Si} \approx a_D$$

The condition $$2a_{Si} = 3a_D \quad (1)$$

is, however, not precisely satisfied. Furthermore, it has been speculated, in accordance with the invention, that if the corresponding relationship were precisely satisfied, one could expect direct epitaxial growth without misorientation and without grain boundaries.

In reality, $2a_{Si}$ is approximately 1½% larger than $3a_D$. This is now seen as the reason why an adaptation arises with a corresponding faulty orientation (twisting and tilting) in the 1-degree region.

The basic concept of the present invention is that if one could reduce the lattice constant of silicon substrate by about 1%, so that $2a_{Si}3a_D$, i.e. so that the condition (1) is precisely satisfied, the growth of single crystal diamond layers without substantial structuring should be possible on such a silicon substrate.

Furthermore, the invention recognizes that the desired reduction of the lattice constant of silicon by the incorporation of foreign material atoms on substitutional lattice sites of the crystalline silicon can be achieved. It is, for example, known that carbon as a group-IV-element can be electrically neutrally incorporated in crystalline silicon at substitutional lattice sites. Since carbon atoms are considerably smaller than silicon atoms, the incorporation of carbon leads to a volume reduction of the silicon crystal. In simplified manner, one can say that the volume of a silicon crystal reduces for each substitutionally incorporated carbon atom by an atomic volume $\Omega Si$ of the silicon. This is explained in more detail in the article by U. Gösele in MRS-Proc. Vol. 59 (1986), pages 419 to 431.

Thus, a corresponding reduction of the average lattice constant $a_{Si(C)}$ results in dependence on the concentration $C_c$ of the incorporated carbon.

The relationship $$a_{SiC}(C_c) \cong a_{Si}(1 - \alpha C_c) \qquad (2)$$

applies approximately, with $\alpha$ having the value of $6,9 \times 10^{-24}$ cm$^{-3}$. From this it can be calculated that a carbon concentration of approximately $2 \times 10^{21}$ cm$^{-3}$ (corresponding to approximately 1,5%) would be necessary in order to largely accurately satisfy the relationship (1). Since the diamond deposition takes place at elevated temperatures in the range of 800° C., the different thermal expansion of diamond and silicon should also be taken into account, so that the relationship (1) applies at the deposition temperature and not necessarily at room temperature. The taking into account of the different coefficients of thermal expansion, however, only leads to a small modification of the carbon concentration that is required.

The solubility of carbon in silicon in thermal equilibrium is known and is extremely small (maximum about $10^{17}$ cm$^{-3}$) compared to the carbon concentration of approximately $2 \times 10^{21}$ cm$^{-3}$ required for the desired reduction in size of the lattice. It has, however, been shown that it is possible by means of both CVD processes and also by means of molecular beam epitaxy to grow carbon at these high concentrations (corresponding to a lattice contraction of ca. 2.5% and more) into epitaxial silicon layers in a meta-stable form, as can be found in the literature. In this connection reference is made to the following documents:

C. Guedj et al., J. Appl. Phys. 84 (1998) 4631,

W. Faschinger et al., Appl. Phys. Lett. 67 (1995) 2630,

A. R. Powell et al., J. Vac. Sci. Technol. B11 (1993:) 1064.

At higher temperatures and with correspondingly longer tempering times, substitutionally dissolved carbon precipitates out in the form of silicon carbide precipitations. For the handling of epitaxial growth processes, the epitaxial silicon layers with a carbon content are grown on silicon crystals, and a problem arises in that the carbon-rich silicon layers adopt the lattice constant of silicon parallel to the plane of growth and not the lattice constant which is to be expected from the relationship (2).

The carbon-rich layer is subjected to a high tensile stress, it represents a strained layer. A reduction of the tensile stress and an associated relaxation of the lattice constant of the layer by mismatched dislocations does not occur in practice, because the corresponding dislocations have only a negligible mobility in the carbon-rich material. At higher temperatures silicon carbide precipitation preferentially takes place instead of relaxation via mismatched dislocations. In order to overcome this problem, the invention provides that the strained carbon-rich silicon layer must be transferred into an at least partly relaxed state in which it adopts the desired lattice constant $a_{SiC}$ by relaxation and as a result of the selected concentration of foreign material. This can be realized when the carbon-rich layer is no longer mechanically fixedly connected to the silicon substrate on which it was grown, and a simple relaxation is thereby possible.

Since large area free-standing thin layers (with thicknesses typically under one micron) are not easy to handle technologically, it is desirable to reattach the correspondingly relaxed layers (with the now desired small lattice constant) to an appropriate carrier substrate. In this respect silicon is again preferred because it has practically the same thermal coefficient of expansion as the highly carbon doped silicon layer.

It is evident from the explanations given above how one can produce an initially strained carbon-rich silicon layer for the manufacture of a suitable substrate for the subsequent grown of a single crystal diamond layer and can then place this strained layer in a relaxed state so that it adopts a lattice constant ($a_{Si(C)}$) which satisfies the condition $2(a_{Si(C)}) = 3a_D$ and also that the relaxed layer forms the substrate or at least the effective surface of a substrate for the epitaxial growth of the diamond layer.

It is not absolutely essential to use carbon atoms for the manufacture of the strained layer, but rather other foreign materials can be considered. It is also not essential for the substrate to consist of monocrystalline silicon, but rather other monocrystalline materials can also be used, providing the desired strained layer with the incorporated foreign material atoms on substitutional lattice sites can be grown thereon.

One possibility of placing the strained layer in a state in which it can relax by relaxation and adopt the desired lattice constant ($a_{Si(C)}$) lies in producing a separation of the strained layer from the substrate. This can be achieved by etching trenches in a predetermined pattern into the strained layer and by etching away a layer arranged beneath the strained layer through the trenches by subsequent etching process by means of a suitable etching liquid. In this way the trenches are preferably so formed that square or rectangular regions of the strained layer arise.

It is particularly advantageous if, after the separation of the strained layer from the substrate by the etching liquid, the substrate with the now relaxed layer, which is still weakly coupled in place via the etching liquid, is removed from the etching liquid and the etching liquid present between the previously strained and now relaxed layer on the substrate is removed, whereby the relaxed layer comes to lie directly adjacent the remaining substrate and bonds with the latter in the relaxed state, for example through the formation of covalent bonds, whereby the remaining substrate becomes the carrier substrate.

Specifically, one can proceed in such a manner that one uses an SOI substrate in which a monocrystalline silicon layer is coupled via a silicon dioxide layer to an insulator, for example bonded to it, that the thickness of the silicon layer is reduced to a desired layer thickness $d_{SOI}$, optionally by suitable thermal oxidation and then separation of the thermal oxide, for example by hydrofluoric acid, that a strained carbon-rich layer with the layer thickness $d_{Si(C)}$ is epitaxially grown onto the silicon layer, that the trenches are produced through the Si(C) layer and the lower lying Si layer by a dry etching process known per se which is highly selectively stopped at the silicon dioxide layer of the Si substrate, and that the separation of the strained layer from the insulator is carried out by dissolving the buried silicon dioxide layer of the SOI substrate in a bath with diluted hydrofluoric acid.

A silicon layer is preferably epitaxially grown onto the Si(C) layer prior to the etching of the trenches, and indeed with a thickness which corresponds essentially to the thickness of the Si layer lying beneath it, with both the thickness of the silicon layer beneath it and also the thickness of the cladding layer of silicon being selected to be substantially smaller than the thickness of the Si(C) layer, for example at least 10 times smaller and preferably orders of magnitude smaller. Since the Si(C) layer is arranged between two Si layers of at least substantially the same thickness, the strain which originates from these Si layers is relatively small, because the layers are thin. Furthermore, the presence of two Si layers of the same thickness on both sides of the Si(C) layer ensures that no bending deflection of the layer system takes place, which would be deleterious to the mechanical stability and the subsequent bonding process.

The dissolving of the silicon dioxide layer should in particular take place with a horizontal arrangement of the structure in the bath of dilute hydrofluoric acid because in this way the thin separated layer is supported carefully over its full area and any tendency of the separated layer to slide away from the lower lying substrate under the action of gravity is avoided.

It is not absolutely essential to use an SOI substrate for the epitaxial growth of the carbon-rich strained Si(C) layer, but rather one can grow this layer directly onto a monocrystalline silicon wafer as substrate.

The invention furthermore provides a method for the manufacture of a single crystal diamond layer which is characterized in that one grows the latter onto a relaxed layer which has been manufactured in accordance with one of the above-explained processes and which satisfies the corresponding condition $n a_{Si} = m a_D$.

After the manufacture of an epitaxial diamond layer without pronounced grain boundaries, the latter can be duplicated in accordance with a further development of the invention.

In other words, after the growth of a correspondingly thick single crystal diamond layer on a relaxed carbon-doped silicon substrate a thin film of this diamond layer is separated from the remainder of the diamond layer by a suitable hydrogen implantation process and bonded by a wafer bonding process to a carrier wafer. This process can be repeated multiply so that a plurality of carrier wafers with bonded on diamond layers can be produced from the original diamond layer. A further diamond layer can be grown epitaxially on each carrier wafer with a bonded on diamond layer and the hydrogen implantation process and wafer bonding process can be repeatedly used in order to produce even more carrier wafers with bonded on diamond layers. The original substrate with the relaxed carbon-rich silicon layer can also be multiply used or reused for the growth of further diamond layers which can then likewise be transferred by means of the hydrogen implantation process and the wafer bonding process to carrier wafers.

The method can also be carried out so that an epitaxial single crystal diamond layer in the layer thickness range above approximately 1 mm is produced over areas which are larger than approximately 1 square millimeter in order to realize the manufacture of diamond jewels.

The separation of the diamond layer in the region of the hydrogen-rich buried layer is preferably carried out in that the bonded wafer is held at a temperature of about 800° C. for a sufficient time in order to produce microcrack formation in the hydrogen-rich layer (38) and subsequent splitting off of the carrier wafer (42) with the bonded on diamond layer (32A) along the microcracks and parallel to the substrate surface. The epitaxial production of the diamond layer is preferably carried out by a CVD process known per se.

The present invention has general validity in the sense that the method can be used for the manufacture of a suitable substrate for the subsequent growth of a single crystal material layer with any desired lattice constant $a_D$. The general process is characterized by the following steps:

a) selection of a substrate of a monocrystalline material with a fixed lattice constant ($a_{Si}$) different from $a_D$ or with a layer consisting of such a material, b) production of a strained epitaxial layer of another material with foreign material atoms incorporated at substitutional lattice sites on the monocrystalline material of the substrate, c) transfer of the strained layer into an at least partly relaxed state in which it adopts through relaxation and through the selected foreign atom concentration a lattice constant ($a_{Si(C)}$) which satisfies the condition $$n \cdot a_{Si(C)} = m \cdot a_D$$

with n and m being integers, preferably different integers, and wherein the relaxed layer forms the substrate or substrate surface for the epitaxial growth of the material layer with the desired lattice constant $a_D$.

For the sake of completeness reference should be made at this point to the article by Jean-Francois Damlencourt, Jean-Louis Leclercq, Michel Gendry, Michel Garrigues, Nabil Aberkane and Guy Hollinger with the title "Paramorphic Growth: A New Approach in Mismatched Heteroepitaxy to Prepare Fully Relaxed Materials", in Japanese J. Appl. Pys., Volume 38, (1999) pages 996 to 999.

The method described there is concerned with the preparation of a thin relaxed starter layer ("seed membrane") (specific case described there $In_{0.65}Ga_{0.35}As$) with a fixed lattice constant on a monocrystalline substrate (in the specific case of InP) with a different lattice constant in order to then grow thicker layers of the same material ($In_{0.65}Ga_{0.35}As$) without strain on the thin relaxed starter layer.

For this purpose the starter layer is first epitaxially grown in the form of a thin pseudomorphic strained layer of a composition corresponding to that of the desired layer onto a sacrificial layer present on the substrate. The starter layer is subsequently separated from the substrate by removal of the sacrificial layer by chemical etching and is bonded in the relaxed state to the substrate again after the relaxation has taken place.

In the specific example the sacrificial layer is grown onto a buffer layer of AlInAs present on the substrate. For the chemical etching of the sacrificial layer trenches were etched through the starter layer and the sacrificial layer into the buffer layer in order to define square areas of the starter layer of 40×40 $\mu m^2$ to 300×300 $\mu m^2$ which were connected directly to the substrate via trampoline arms. The trampoline arms are on the one hand intended to enable the relaxation of the square regions of the starter layer, but on the other hand to ensure the retention of the crystallographic alignment of these regions with the substrate.

The process described there has also been further developed as can be read in the non-prior published article "High-quality fully relaxed $In_{0.65}Ga_{0.35}As$ layers grown on InP using the paramorphic approach" by J. F. Damlencourt, J. L. Leclercq, M. Gendry, P. Regrany and G. Hollinger in Appl. Phys. Letter, 75, volume 23, of Dec. 6, 1999, pages 3638 to 3640.

Furthermore, the present invention includes a substrate which has been manufactured in accordance with one of the above-described methods, in particular a substrate which is suitable for the subsequent growth of a single crystal diamond layer on at least one of its surfaces with the special characteristic that a layer is present at the said surface of the substrate which has a lattice constant ($a_{Si(C)}$) through relaxation of the selected foreign material concentration, which satisfies the condition $n \cdot a_{Si(C)}$, with n and m being integers and $a_D$ being the lattice constant of diamond, with the relaxed layer forming the substrate for the epitaxial growth.

Furthermore, the present invention includes a carrier wafer with an epitaxial single crystal diamond layer bonded on via a bond layer and diamond jewels which can be produced from the diamond layers in accordance with the invention.

The invention will be explained in the following in more detail with reference to embodiments and to the drawings.

DESCRIPTION OF THE PREFERRED EMBODIMENTS

In the following, various methods will be described in more detail as to how a carbon-rich silicon layer can be produced and separated from the original substrate so that an elastic relaxation to the desired lattice constant takes place. In a second step the relaxed layer manufactured in this way is then bonded by means of a wafer bonding process to a silicon substrate wafer again and the substrate wafer can also be the original substrate wafer on which the carbon-rich epitaxial layer was grown.

In the embodiment of FIG. 1 a so-called SOI substrate 10 is taken as the starting material and consists in this example of a single crystal silicon layer 12 which is connected via a silicon dioxide layer 14 to an insulator 16. Such SOI substrates are available commercially in diameters up to 300 mm. The commercially available silicon layer 12 of 100 to 300 nm thickness is however too thick for the present invention and is first reduced to about 10 nm to 100 nm. This can be achieved by suitable thermal oxidation of the silicon layer and separation of the thermal oxide by hydrofluoric acid. The reduction of the thickness of the silicon layer 12 is schematically shown in the cross-sectional drawing of FIG. 1B, where the layer 12 is significantly thinner than in the corresponding cross-sectional drawing of the starting substrate in accordance with FIG. 1A.

Figures 1A, 1B:
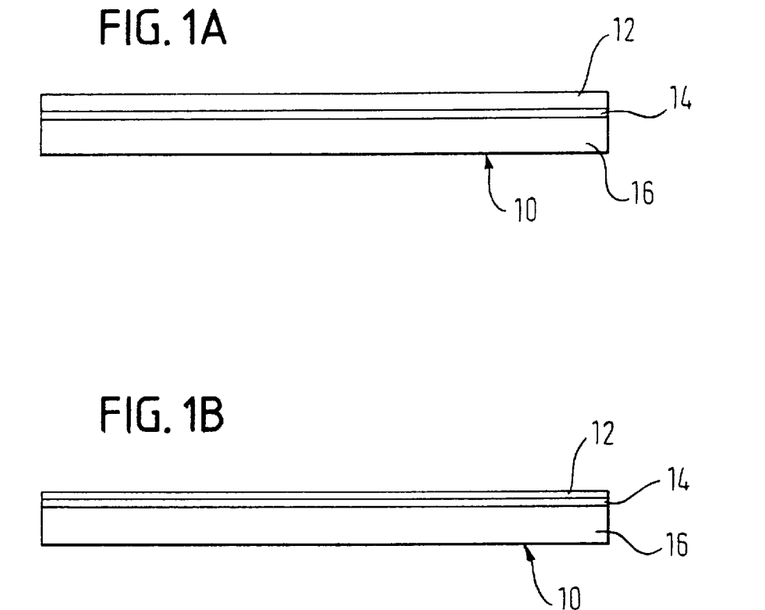
FIGS. 1A–1I are a sequence of sketches to explain a first embodiment of the method of the invention for the manufacture of epitaxial monocrystalline diamond layers without pronounced grain boundaries.
Figure 1C:
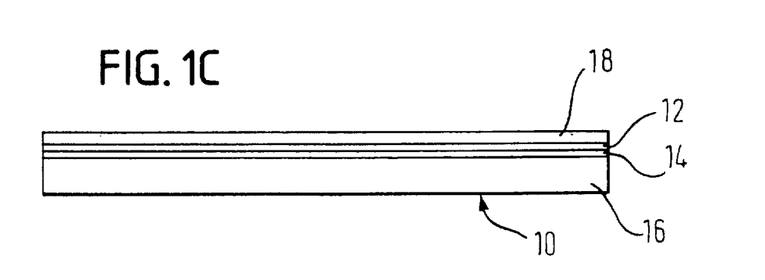

A carbon-rich Si(C) layer 18 with a layer thickness $d_{Si(C)}$ of typically a few 100 nm is first grown epitaxially onto the substrate 10 of FIG. 1B, i.e. onto the silicon layer 12, as can be seen from FIG. 1C. The epitaxial growth of this carbon-rich layer can be effected in accordance with the named documents.

A silicon cladding layer 20 (without carbon doping) is then grown epitaxially onto this layer 18 in accordance with FIG. 1B for later mechanical stress compensation, with its thickness $d_{Deck}$ corresponding to the reduced layer thickness $d_{SOI}$ of the silicon layer 12 of the SOI substrate 10. The carbon concentration in the carbon-rich layer 18 is so selected in this arrangement that the sandwich consisting of the two silicon layers 20, 12 and the carbon-doped layer 18 has the desired lattice constant in accordance with the relationship (1) when this sandwich is separated from the insulator 16 by removal of the silicon dioxide layer 14 and has relaxed. In order to keep the carbon concentration in a technologically available range, it is thus necessary for $$d_{SOI} + d_{Deck} \ll d_{Si(C)},$$

i.e. $d_{SOI}$ plus $d_{Deck}$ should preferably be an order of magnitude or more smaller than $d_{Si(C)}$.

Figure 1D:
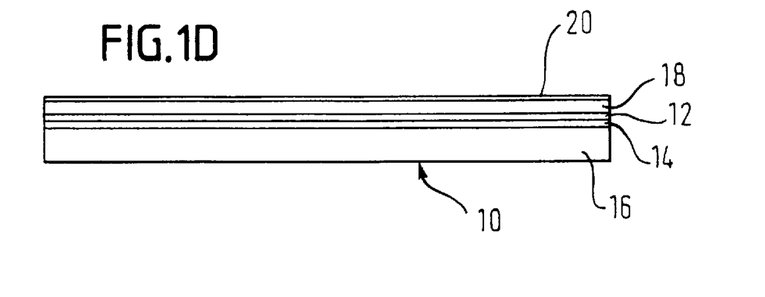
Figure 1E:
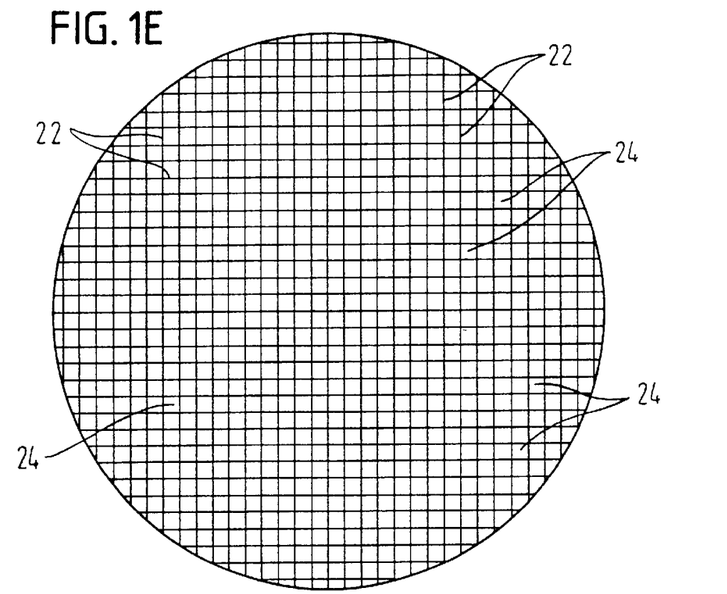

The so grown structure of FIG. 1D is now suitably structured by means of photolithographic methods, and indeed in such a way that trenches 22 are etched in a predetermined pattern into the Si/Si(C)/Si layer sandwich 20, 18, 12. FIG. 1E shows the wafer 10 with these trenches 22 in a square pattern. Dry etching processes which stop highly selectively at the buried oxide layer of the SOI substrate are preferred for the etching of the trenches 22.

As shown, squares or rectangles with a side length of up to about 1 cm can be selected as a pattern for the trenches. The total silicon wafer would then be covered with such squares or rectangles 24 separated from one another by trenches.

Figure 1F:
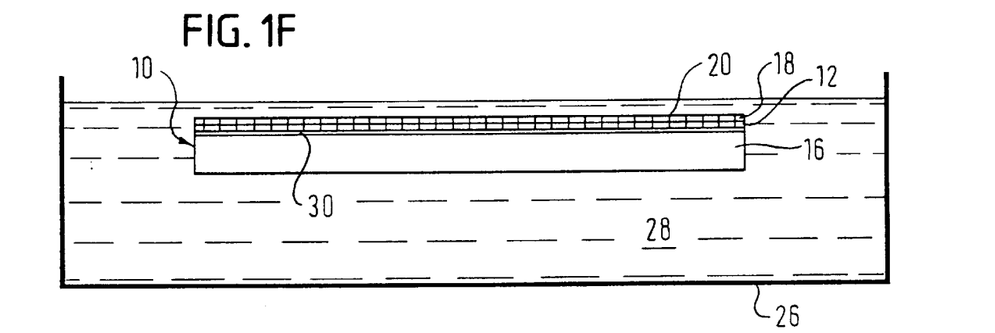

As a next step the so structured wafer is placed as horizontally as possible into a bath 26 with dilute hydrofluoric acid 28 which dissolves the oxide layer 14 also beneath the epitaxial layer sandwich 20, 18, 12. In the representation of FIG. 1F this dissolving has already been completed. Because of the surface tension of the liquid, the epitaxial layers, however, continue to stick to the substrate wafer via a liquid layer 30 of the etching liquid. Since the coupling via the liquid layer 30 is very weak, the elastically strained epitaxial layer sandwich 20, 18, 12 will contract to its natural lattice constant.

Figure 1G:
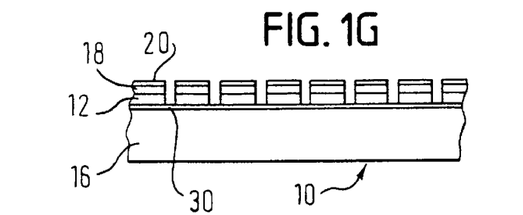

In a next step the wafer is removed from the hydrofluoric acid solution, as is shown in FIG. 1G. For the sake of illustration, FIG. 1G shows only a section of the wafer and at a scale enlarged relative to FIG. 1F.

Figure 1H:
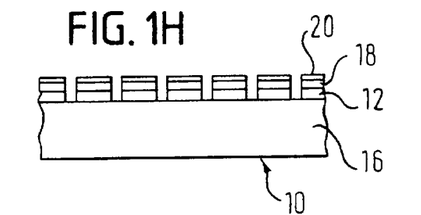

After a correspondingly long period of waiting at room temperature or after a correspondingly shorter waiting at a slightly elevated temperature (below the boiling point of the etching liquid consisting of hydrofluoric acid), this liquid 30 evaporates and also disappears from the regions beneath the separated carbon-rich epitaxial layer 18, as shown in FIG. 1H.

An increase of the temperature after the evaporation of the liquid to a few 100° C. (typically 400–600° C.) leads to an intimate covalent bond between the separated epitaxial layer sandwich 20, 18, 12 and the original substrate in the form of the insulator 16.

One now has available a sandwich structure in which many separate square regions 24 exist on an insulator 16 which can itself be a silicon wafer and within which a thin Si/Si(C)/Si layer sandwich 20, 18, 12 with the desired smaller lattice constant in accordance with the relationship (1) is covalently bonded onto the silicon substrate. FIG. 1H is also to be considered as representative for this bonded structure, since the structure has not changed through the bond process relative to the method step of evaporating the etching solution.

Figure 1I:
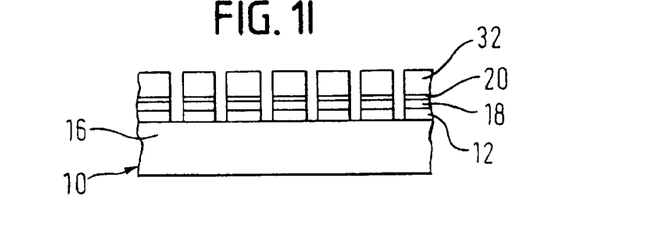

Single crystal diamond layers 32 can now be deposited in accordance with customary CVD processes at elevated temperatures onto epitaxial layers of the desired lattice constant in accordance with the basic principle of the invention, as is schematically illustrated in FIG. 1I. In this respect attention should be paid to the fact that the deposition takes place as far as possible at temperatures at which the process of silicon carbide precipitation takes place so slowly that no substantial increase of the lattice constant of the carbon doped silicon layer occurs during the diamond deposition.

As a variant, it is also possible to remove the layer 20 and to grow the diamond layer directly onto the Si(C) layer 18. This variant should, however, first take place after the bonding onto a substrate. Prior to this, this Si layer 20 has the task of compensating for mechanical stresses which arise from the lower Si layer 12. Otherwise, the layer will bend and the bonding will be made more difficult and possibly prevented. After the bonding one could, however (as stated), remove the layer 20 (does not however have to do so), which may perhaps have advantages.

It can be seen from the above explanations that the manufacture of the suitable substrate, for example in accordance with FIG. 1H, for the growth of single crystal diamond layers requires a considerable technical effort. It would therefore be desirable if this substrate could be multiply used. In the following a corresponding process for this will be set out with reference to FIGS. 2A–2G. For many applications it is sufficient to have a thin single crystal diamond layer (typically under one micron thickness) on a suitable substrate, which should have a thermal conductivity which is as high as possible and a similar thermal coefficient of expansion to diamond.

Figure 2A:
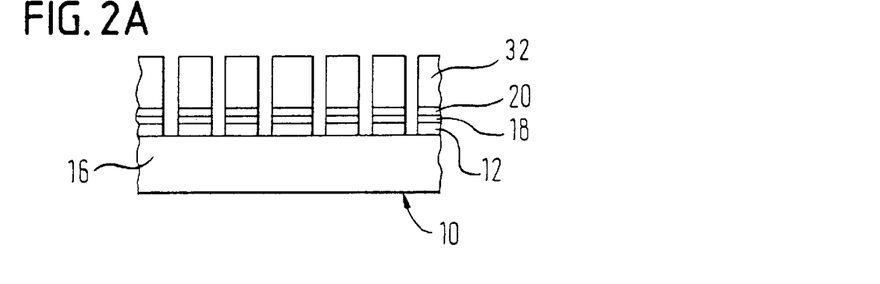
FIGS. 2A–2G are a further sequence of sketches to explain a possibility in accordance with the invention for the duplication of diamond layers.
Figure 2B:
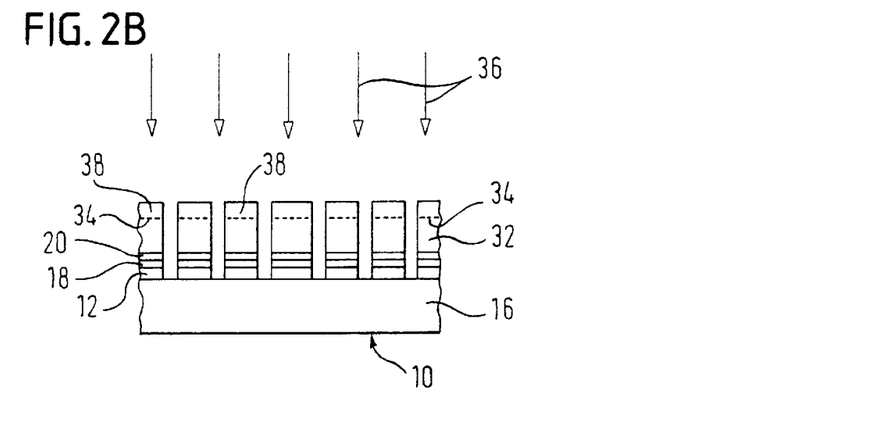
Figure 2C:
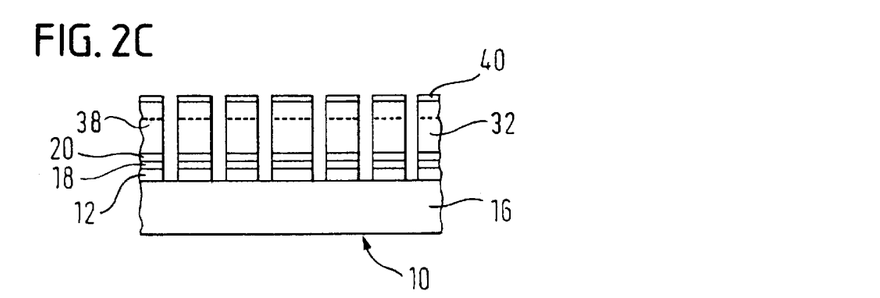
Figure 2D:
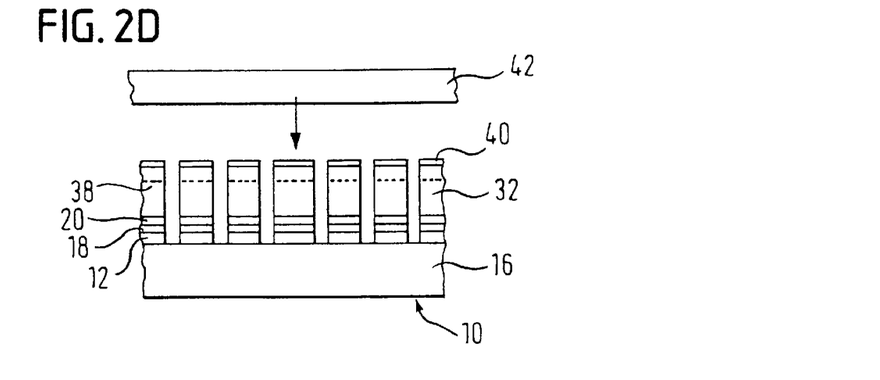
Figure 2E:
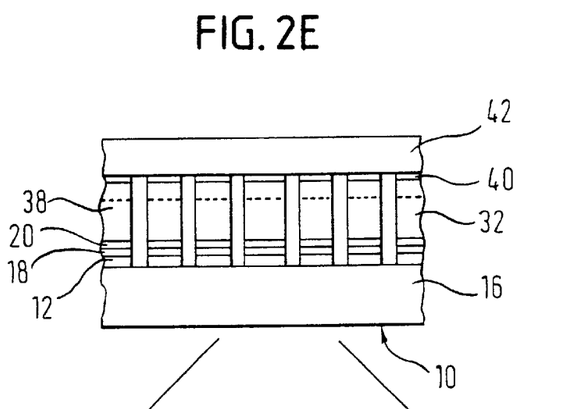
Figure 2F:
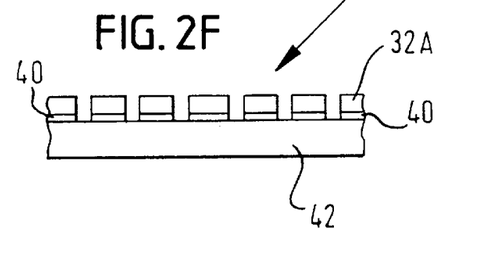
Figure 2G:
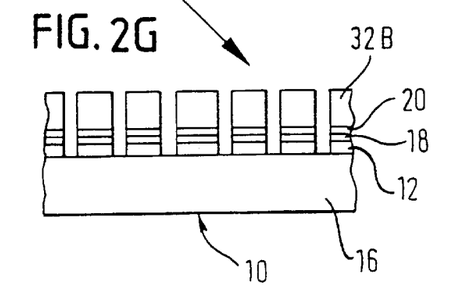

The starting point for the present further development of the invention is a substrate in accordance with FIG. 1I with an already deposited epitaxial single crystal diamond layer of many microns, for example 10 $\mu$m. This diamond layer 32 is now implanted, in accordance with FIG. 2B, with hydrogen ions 34, with the implantation process, which is known per se, being represented by arrows 36. The implantation takes place with hydrogen ions in the dose range of $10^{16}$–$10^{17}$ cm$^{-2}$ and with typical energies of 20 keV–200 keV, so that the hydrogen-rich buried layer 38 forms in the diamond layer 32 at a depth which results from the implantation energy. Implantation depths in the range from 100 nm to 1000 nm can easily be realized. Prior to or after the hydrogen implantation a thin bond layer 40 is deposited on the diamond layer, as can be seen in FIG. 2C, with the bond layer having been deposited in FIG. 2C after the hydrogen implantation. This bond layer can, for example, consist of polysilicon, CVD silicon dioxide or CVD silicon nitride and should be selected in accordance with the envisaged use of the diamond layer. This bond layer is so prepared by means of appropriate chemo-mechanical polishing that a carrier wafer 42, for example in the form of a silicon substrate or an SOI substrate, can subsequently be bonded to the so prepared free surface of the bond layer 40 and thus to the diamond layer 32. This bonding process is schematically indicated in FIG. 2D. The result can be seen in FIG. 2E.

The heating up of the so bonded structure to a temperature of above about 800° C. for a sufficiently long time, as is for example described in the document Q.-Y. Tong et al., Appl. Phys. Lett. 70 (1997) 1390 and U.S. Pat. No. 5,877,070 (1999), Gösele et al., then leads to microcrack formation in the hydrogen-rich layer 38 and finally to a splitting off of one of the wafers along the microcracks and parallel to the bonding boundary surface, such as is known as a "smart cut" in the case of silicon, as is described in the document M. Bruel, Electronics Lett. 31 (1995) 1201.

Thus, a single crystal diamond layer 32A is then transferred via the thin bond layer 40 onto a suitable substrate in form of the carrier wafer 42. The surface of the transferred layer 32A can now—if necessary—be subjected to fine chemical mechanical polishing. Appropriate polishing recipes have been set forth in literature and discussed, for example in the article by Haisma et al., Philips J. Res. 49 (1995) 23.

The carrier wafer 42 with the diamond layer 32A can now be used for various purposes. On the one hand, this structure can be used for electronic purposes. On the other hand, the diamond layer 32A can also be enlarged in thickness by further epitaxial deposits of diamond material by means of the CVD process known per se, so that, for example, diamond jewels for industrial purposes arise. Another possibility is to grow further diamond material epitaxially onto the diamond layer 32A and to produce further carrier wafers 42 with a bonded on diamond layer 32A in accordance with FIG. 2F by hydrogen implantation. The original substrates 16 with the remainder of the diamond layer 42B can be reused. For example, the process of hydrogen implantation induced transfer of single crystal diamond layers can be correspondingly multiply repeated with this substrate, so that a plurality of carrier wafers 42 with a bonded on diamond layer 32A can be produced from the starting structure of FIG. 2A. The original substrate 16 with the diamond layer 32B of FIG. 2G can also be used, if necessary after a correspondingly fine polishing, for the growth of a thick diamond layer, and can be used again as a starting substrate in accordance with FIG. 2A. It can also be used for the further applications which have been described in connection with the structure of FIG. 2F.

Instead of square and separate individual regions of carbon-rich epitaxial silicon layers it is also possible to leave the inner part of the silicon wafer with a continuous, carbon-rich layer and to form suitably dimensioned spring structures by etching in a marginal region only (with well-known methods from the field of silicon micromechanics). After the etching away of the whole area silicon wafer from the rear side (apart from a ring-like marginal region which serves as a holder) these spring structures permit the inner, separated, carbon-rich epitaxial layer to relax. In this connection the buried oxide layer of the SOI substrate serves as an etch stop layer, which can in turn be easily dissolved away by means of hydrofluoric acid. Then a suitable wafer bonding step takes place (see the literature; Gösele and Tong 1998) for the anchoring of the relaxed carbon-rich silicon layer onto a silicon substrate. Instead of the large area separation of the base substrate it is also possible to provide the carbon-rich epitaxial layer in the inner region of the wafer with a plurality of holes which permit the lower lying oxide to be etched away with hydrofluoric acid.

The embodiment with spring structures will now be explained in more detail with reference to FIGS. 3A–3D.

In the subsequent embodiments elements which correspond to elements of the previous drawings will be characterized by the same reference numerals but increased by a basic number such as 100, 200, 300 or 400 in order to differentiate the different embodiments. The previous description of the individual elements also applies for the correspondingly numbered elements in the further embodiments, unless something is stated to the contrary.

The reference numeral 110 signifies a SOI substrate which originally had the form of a continuous wafer substantially circular in plan view in accordance with the broken lines 111. The SOI substrate also consists here of an insulator 116, an oxide layer 114, and a monocrystalline Si layer 112, which has also been reduced in thickness here to about 10 nm to 100 nm. In this embodiment a thicker Si(C) layer 118 having a thickness approximately 10 times larger than the thickness of the Si layer 112 is also present on the Si layer 112. This Si(C) layer 118, i.e. Si with carbon doping, was epitaxially grown in accordance with one of the initially named methods onto the layer 112, so that the carbon atoms are located at substitutional lattice sites. A further thin monocrystalline Si layer 120 with the same thickness as that of the layer 112 is present on the Si(C) layer 118. The Si—Si(C)—Si layer system 112, 118, 120 is designated in FIGS. 3A, 3C and 3D by 121 and is only shown at the right-hand side of the respective drawing for the sake of representation. The structure 121, however, extends over the full area of the wafer.

Figure 3A:
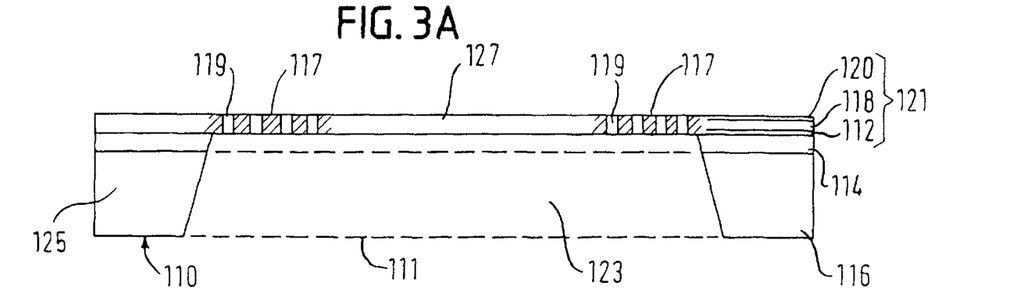
FIGS. 3A–3D are a further sequence of sketches to explain the second embodiment of the method of the invention utilizing spring structures.
Figure 3B:
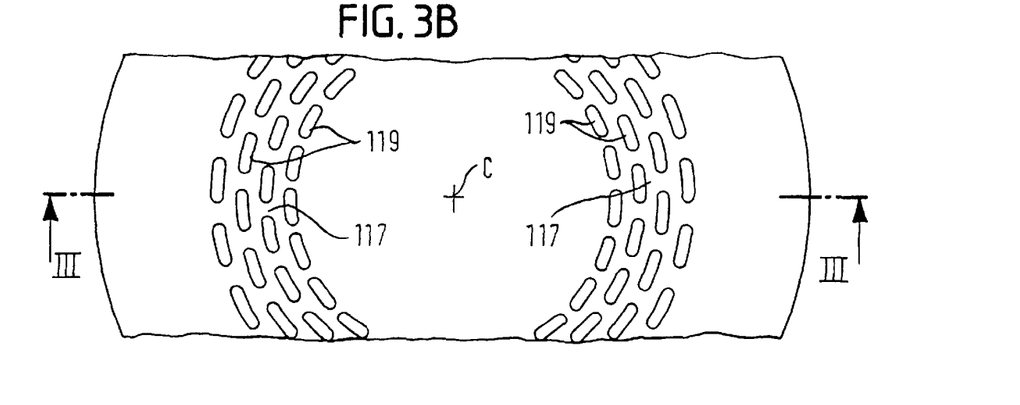

In the plan view of FIG. 3B only a strip of the wafer is shown. It will, however, be understood that the structure shown there extends circularly about the center point C.

Figure 3C:
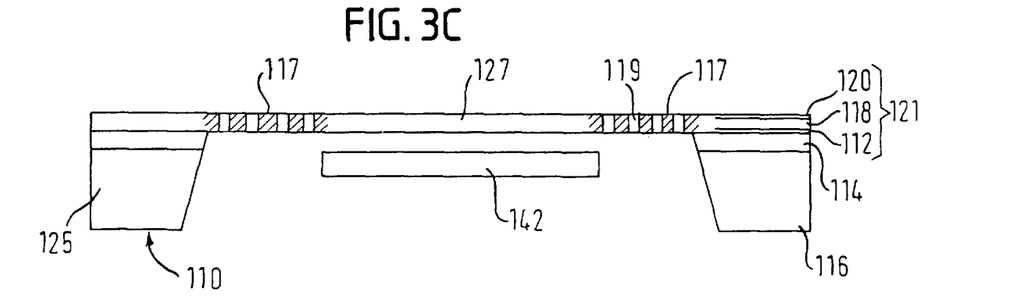
Figure 3D:
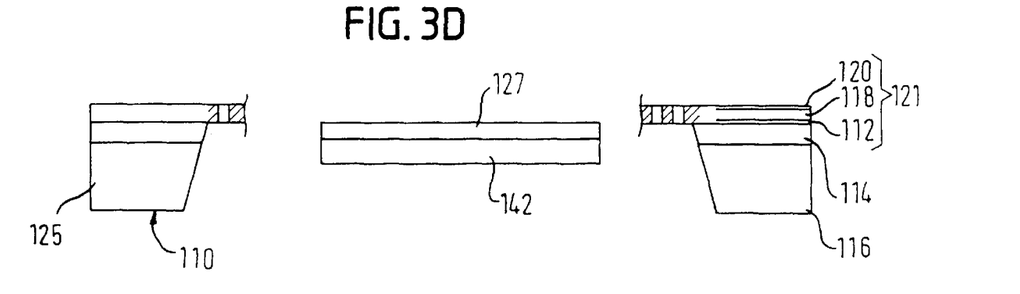

FIGS. 3A, 3C and 3D are to be understood as cross-sections which are shown in accordance with the section plane III—III in FIG. 3B.

The structure shown in FIG. 3A includes spring structures 117 in the marginal region which are shown in plan view in FIG. 3B and are realized in this embodiment by the generation of suitably arranged and dimensioned holes 119. In other words, the spring structures 117 are formed by the regions of the wafer which remain between the holes.

This type of structuring can also take place by an etching process. For example, the holes 119 can be holes which are elliptical in plan view and which are produced by means of photolithography and chemical etching or plasma etching.

After the etching away of the middle regions 123 of the SOI substrate beneath the Si layer 112, a ring-like region 125 remains from the original substrate 110 which serves as a holder for the membrane-like middle region of the layer system 121 consisting of the continuous middle portion 127 and the ring-like region 129 having the spring structure 127, with the middle portion 127 now being at least substantially relaxed, since the spring structure 117 has expanded, i.e. yielded elastically, as a result of the tensile stress which previously prevailed in the previously strained middle portion.

The carbon concentration in the carbon-rich Si layer 118 has also been set here so that the middle portion 127 has the desired lattice constant in accordance with the relationship (1) after the relaxation.

A carrier substrate 142, for example of silicon, is now bonded onto the middle portion 127, for example from below, as is schematically illustrated in FIG. 3C. The middle region 144 consisting of the middle portion 127 bonded onto the carrier substrate 142 can now either be separated from the ring-like holder 125 and passed on for further use as shown in FIG. 3D, or the holder 125 can be retained and can serve for the handling of the middle region during further use.

Many variants are conceivable.

A further possibility of attaching the carrier substrate 142 consists, for example, in attaching this not from below but rather onto the top of the wafer (related to the representation drawn in FIG. 3C). This is easier from a practical standpoint because there is no projecting frame, since the frame, i.e. the holder 125, extends downwardly in the orientation of the wafer as shown. The Si(C) layer 118 or the Si—Si(C)—Si layer system 121 is largely symmetrical, so that it makes no difference whether one subsequently grows a diamond from the underside or from the top side. After the bonding of the carrier substrate to the top side of the wafer, which can also take place over the entire surface and not only over the middle membrane region 127, the projecting frame 125 can also be removed.

When, as described above, an SOI substrate 110 is used, it is necessary for the Si(C) layer 118 to be included between two Si layers 112 and 120. One needs the lower Si layer 112 as a single crystal epitaxial substrate, because one cannot grow a single crystal layer on the amorphous, non-crystalline oxide. Here the oxide layer 114 serves as an etch stop. After the subsequent removal of the oxide layer 114, the two Si layers could then be removed and the diamond layer grown directly on the Si(C) layer 118. The removal of the Si layers 112 and 120 is, however, not absolutely necessary.

Figure 4:
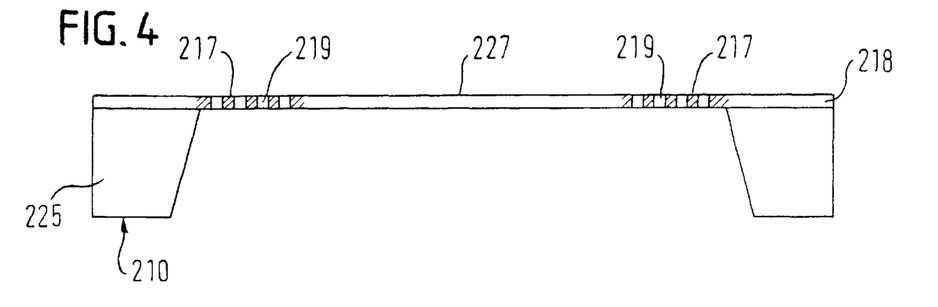
FIG. 4 is a representation corresponding to the cross-section of FIG. 3A but of an alternative embodiment of the invention.

As a further example, a silicon substrate 210 can be used instead of the SOI substrate 110, as is shown in FIG. 4. In this variant, the Si(C) layer 218 is grown epitaxially directly onto the Si substrate. The Si(C) layer 218 then directly acts as an etch stop.

In this connection it is pointed out that for certain, well-known silicon etching solutions a high carbon doped silicon layer represents an excellent etch stop (see the literature; V. Lehmann et al., J. Electrochem. Soc. 138 (1991) L3). Accordingly, it is also possible to realize the above-mentioned etched spring structure at the margin of a wafer in combination with the etching of the silicon wafer away from the rear of the wafer without an SOI substrate. In this case the carbon-rich silicon epitaxial layer directly serves as an etch stop layer, whereas in the previous description the etch stop layer was the buried oxide layer of the SOI substrate that was used. The further steps (relaxation of the separated carbon-rich layer via the spring structure at the edge of the layer, wafer bonding of the layer to a silicon carrier substrate and diamond growth) should be carried out analogously to those described above. That is to say, the oxide layer 114 can be omitted.

Figure 5:
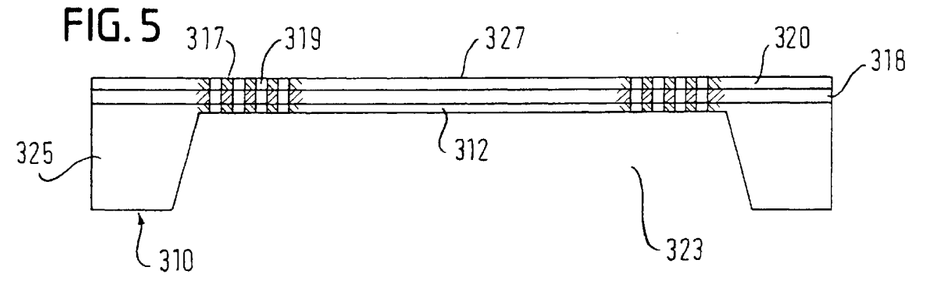
FIG. 5 is a representation in accordance with the cross-section of FIG. 3A, but of a further alternative embodiment of the invention.

The above-described variant of using a silicon substrate instead of an SOI substrate could also be realized as shown in FIG. 5. Here, the carbon-rich silicon layer 318 is grown epitaxially onto the silicon substrate 310 and provided with a cladding layer 320 of silicon, analogously to the embodiment of FIG. 1. When removing the middle region 323 of the Si substrate 310, a thin layer 312 of the substrate 310 consisting of silicon is now left beneath the middle region 327 of the silicon layer 318 doped with carbon, so that this region 327 is now located between two relatively thin Si layers 312, 320, similar to the sandwich arrangement consisting of the layers 12, 18, 20 of the embodiment of FIG. 1.

In an arrangement of this kind the spring structures 317 can be produced by the formation of suitable holes 319 in the three layers 312, 318, 320.

Figure 6:
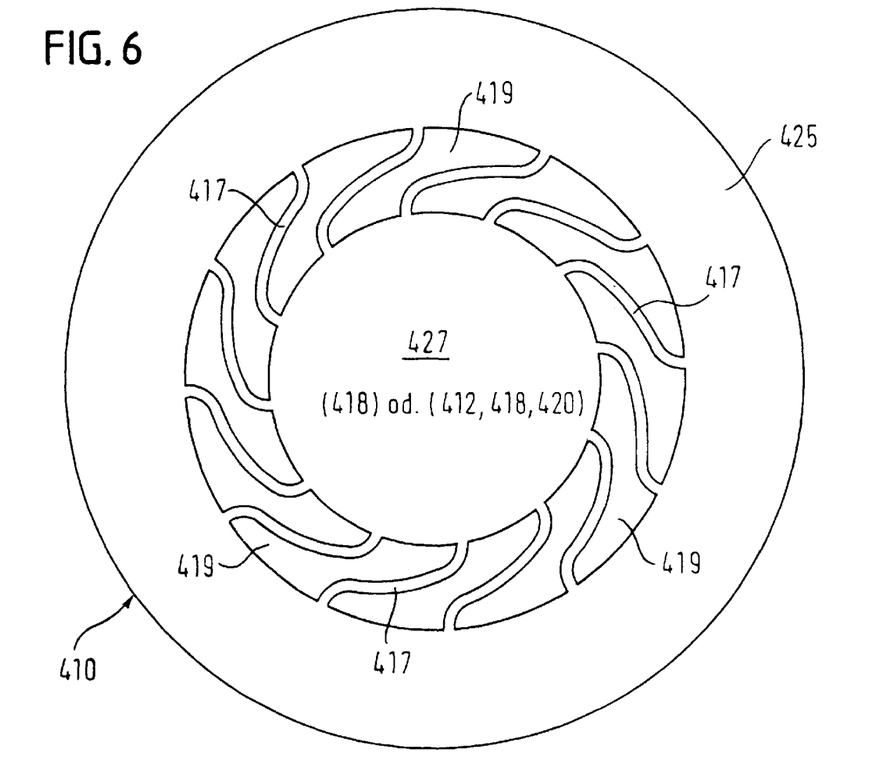
FIG. 6 is a plan view of a semiconductor wafer in order to make clear a further possible inventive design of the spring structure.

The spring structures can also be realized in different manner. One alternative is shown in FIG. 6, where the spring structures 4 and 7 are formed by easily deformable spokes 448 which extend between the middle part 427 and the holder 425 and are separated from one another by corresponding openings 419. In this embodiment the middle region 427 can consist in accordance with FIG. 3A only of Si(C) or of a layer system of Si—Si(C)—Si layers 412, 418, 420.

What is claimed is:

1. Method for the manufacture of a substrate suitable for the subsequent growth of a single crystal diamond layer having a lattice constant $a_D$, the method comprising:

a) selecting one of an initial substrate of a mono-crystalline material having a fixed lattice constant $a_{Si}$ and an initial substrate having a layer comprising a mono-crystalline material having a fixed lattice constant $a_{Si}$, b) manufacturing on said initial substrate one of b1) a strained silicon layer comprising silicon atoms arranged at lattice sites, with foreign material atoms incorporated by substitution at some of said lattice sites, there being a selected foreign atom concentration in said strained silicon layer, and b2) a layer system including a strained silicon layer in accordance with feature b1), c) transferring one of the strained silicon layer of feature b1) and said layer system of feature b2) into an at least partly relaxed state in which it adopts, by relaxation and through the selected foreign atom concentration, a lattice constant $a_{Si(C)}$ which satisfies the condition $$n \cdot a_{Si(C)} = m \cdot a_D$$

where n and m are different integers, with the one of said at least partly relaxed layer and at least partly relaxed layer system forming said substrate suitable for the epitaxial growth of said single crystal diamond layer.

2. Method in accordance with claim 1, wherein said foreign material atoms are carbon atoms, with n=2 and m=3.

3. Method in accordance with claim 1, wherein a respective one of said at least partly relaxed layer and said at least partly relaxed layer system is bonded onto a carrier substrate.

4. Method in accordance with claim 1, wherein said transferring comprises separating a respective one of said strained layer of feature b1) and said layer system from said initial substrate.

5. Method in accordance with claim 4, wherein said separating comprises etching one of trenches and holes into said strained layer in a predetermined pattern and etching away a layer disposed beneath said strained layer through one of said trenches and holes with a suitable etching fluid.

6. Method in accordance with claim 5, wherein said trenches are laid out so that one of square and rectangular regions of said strained layer arise.

7. Method in accordance with claim 5, wherein after separating said initial substrate is removed from said etching fluid together with the respective one of said at least partly relaxed layer and said layer system, which is still weakly coupled to said initial substrate via said etching fluid, and said etching fluid present between said previously strained and now relaxed layer and said initial substrate is removed, whereby said relaxed layer comes to lie directly adjacent to said initial substrate and bonds to it.

8. Method in accordance with claim 5, wherein, for the preparation of said initial substrate, an SOI substrate is used, in which a mono-crystalline silicon layer having a thickness is coupled to an insulator via a silicon dioxide layer, wherein said thickness of said silicon layer is reduced to a desired layer thickness $d_{SOI}$, wherein a strained carbon-rich layer is grown epitaxially on said silicon layer with a layer thickness $d_{Si(C)}$, and wherein said trenches or holes are produced through said strained carbon-rich layer and said silicon layer lying beneath it using a dry-etching process which is stopped highly selectively at said silicon dioxide layer of said SOI substrate, and said strained carbon-rich layer and said silicon layer are separated from said insulator by dissolving said silicon dioxide layer in a bath with dilute hydrofluoric acid.

9. Method in accordance with claim 8, wherein, before the etching of said trenches or holes, a silicon layer is grown epitaxially onto said strained carbon-rich layer with a thickness which corresponds substantially to that of said silicon layer lying beneath it, with said thicknesses of both said silicon layers being selected to be substantially smaller than a thickness of said carbon-rich silicon layer.

10. Method in accordance with claim 9, wherein dissolving of said silicon dioxide layer is carried out with a horizontal arrangement of said SOI substrate in said bath.

11. Method in accordance with claim 5, wherein said initial substrate with said strained layer forms a wafer and said trenches or holes are executed so that an inner part of said wafer with a continuous carbon-rich silicon layer is left and spring structures are etched into a marginal region of said wafer, said wafer being etched away over a full area from a rear side up to a region serving as a holder, whereby a relaxed carbon-rich silicon layer or a relaxed layer system arises.

12. Method in accordance with claim 11, wherein an SOI substrate is used in which a mono-crystalline silicon layer having a thickness is coupled to an insulator via a silicon dioxide layer, said silicon dioxide layer serving as an etch-stop layer and being dissolved by means of dilute hydrofluoric acid.

13. Method in accordance with claim 1, wherein a number of holes are provided in a carbon-rich epitaxial silicon layer forming said strained silicon layer and a silicon dioxide layer formed below said strained silicon layer is etched away through said holes using hydrofluoric acid.

14. Method in accordance with claim 1, wherein a carbon-rich strained silicon layer forming said strained layer is epitaxially grown onto a mono-crystalline silicon wafer defining an initial substrate, a spring structure is produced in a marginal region of said carbon-rich silicon layer, and said initial substrate is etched away using said carbon-rich silicon layer as an etch-stop layer.

15. Method in accordance with claim 14, wherein said previously strained carbon-rich silicon layer which is now relaxed via said spring structure is bonded onto a new carrier substrate.

16. Method for the manufacture of a single crystal diamond layer comprising the step of producing a substrate suitable for the subsequent growth of a single crystal diamond layer in accordance with the method of claim 1 and subsequently growing a single crystal diamond layer on it by epitaxial growth.

17. Method in accordance with claim 16, wherein an epitaxial diamond layer with a thickness of several microns is deposited, said diamond layer is implanted with hydrogen ions using an implantation energy to form a hydrogen-rich buried layer in said diamond layer at a depth resulting from said implantation energy, and bonding said diamond layer to a carrier wafer, and splitting said diamond layer in the region of the hydrogen-rich buried layer thereby producing a diamond layer bonded to said carrier wafer and a diamond layer bonded to said suitable substrate.

18. Method in accordance with claim 17, wherein a thin bond layer is deposited onto an exposed surface of said diamond layer before or after hydrogen implantation, said diamond layer being bonded to said carrier wafer via said bond layer.

19. Method in accordance with claim 17, including repeating using said suitable substrate with said diamond layer bonded thereto to produce a further carrier wafer with a diamond layer bonded thereto.

20. Method in accordance with claim 17, including epitaxially growing a further diamond layer onto said carrier wafer with a diamond layer bonded thereto, and repeating the method of claim 17 to form at least one further carrier wafer with a diamond layer bonded thereto.

21. Method in accordance with claim 16, wherein, for the manufacture of diamond jewels, an epitaxial single crystal diamond layer is grown epitaxially having a layer thickness above 1 mm over an area which is more than 1 square millimeter in size.

22. Method in accordance with claim 18, wherein said the bond layer is selected from a group consisting of polysilicon, CVD silicon dioxide or CVD silicon nitride.

23. Method in accordance with claim 17, wherein said separation of said diamond layer in the region of the hydrogen-rich buried layer is carried out by holding it at a temperature of about 800° C. for a sufficient time to produce microcrack formation in said hydrogen-rich layer and subsequent splitting off of said carrier wafer with said diamond layer bonded thereto along said microcracks and parallel to said suitable substrate.

24. Method in accordance with claim 16, wherein said epitaxial growth of said diamond layer is carried out by a CVD process.

25. Method for the manufacture of a substrate suitable for the subsequent growth of a single crystal material layer of a desired lattice constant $a_D$, the method comprising the following steps:
   a) selecting one of an initial substrate of a mono-crystalline material having a fixed lattice constant $a_{Si}$ different from $a_D$ and an initial substrate having a layer consisting of a mono-crystalline material having a fixed lattice constant $a_{Si}$,
   b) producing on said initial substrate a strained epitaxial layer of another material having lattice sites with foreign material atoms incorporated by substitution at some of said lattice sites on the mono-crystalline material of the substrate,
   c) transferring said strained epitaxial layer into an at least partly relaxed state in which it adopts, through relaxation and through a selected foreign atom concentration, a lattice constant $a_{Si(C)}$ which satisfies the condition $$n \cdot a_{Si(C)} = m \cdot a_D$$

with n and m being integers, and wherein the relaxed layer forms one of said suitable substrate and a surface of a suitable substrate for the epitaxial growth of said material layer with the desired lattice constant $a_D$.

26. A method according to claim 25 wherein the integers are different integers.

27. Method in accordance with claim 1, including sandwiching said at least partly relaxed layer between two silicon layers to form a sandwich, bonding said sandwich onto a carrier substrate leaving one of said silicon layers exposed, removing said exposed layer to expose said at least partly relaxed layer, and growing a diamond layer onto said exposed at least partly relaxed layer.

* * * * *